Figure 4A:
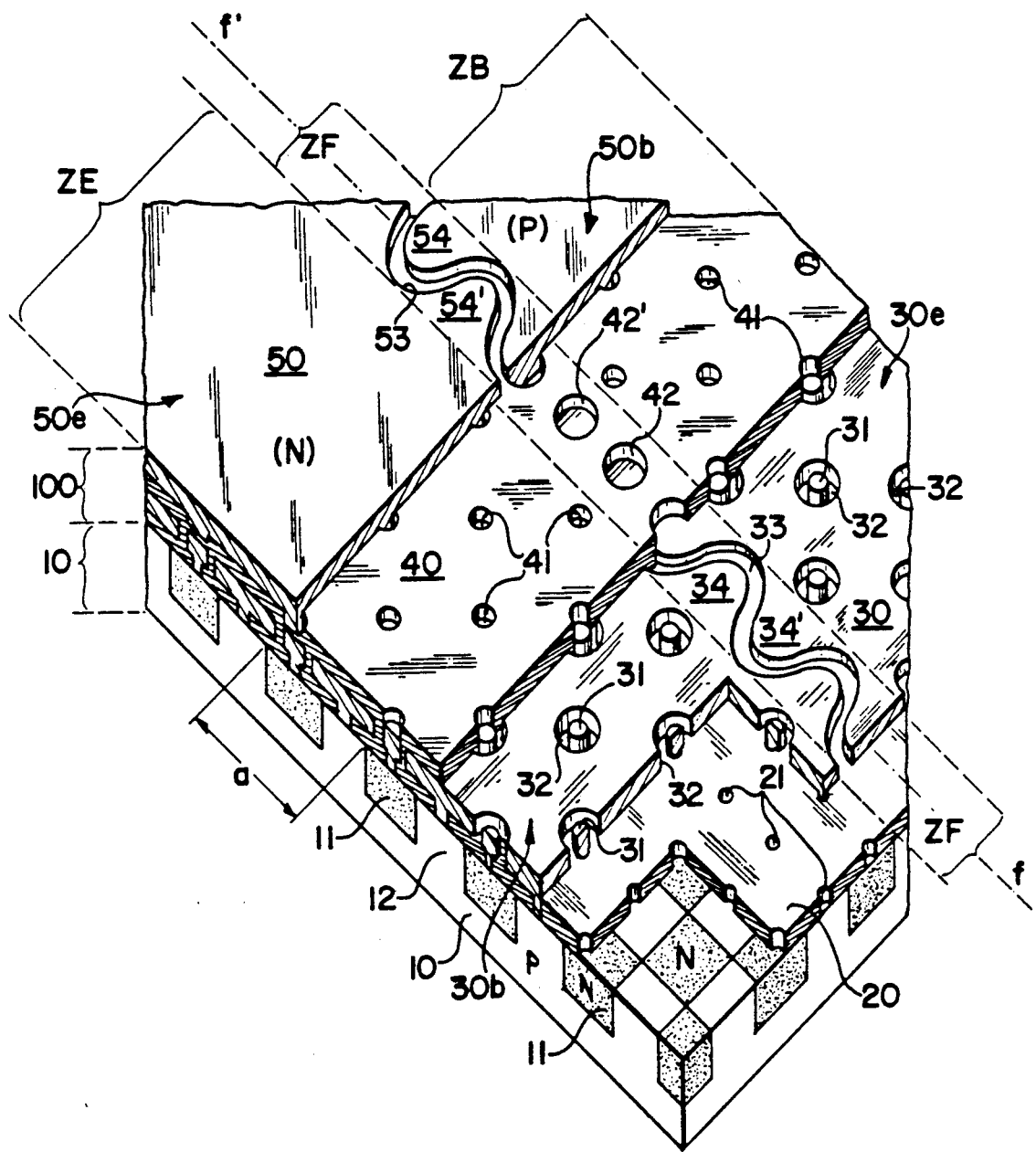

United States Patent [19]

Arnould

[11] Patent Number: 5,025,299
[45] Date of Patent: Jun. 18, 1991

[54] CELLULAR POWER SEMICONDUCTOR DEVICE

[75] Inventor: Jacques Arnould, Aix En Provence, France

[73] Assignee: Telemecanique, France

[21] Appl. No.: 473,766

[22] Filed: Feb. 2, 1990

[30] Foreign Application Priority Data

Feb. 3, 1989 [FR] France ................... 89 01409

[51] Int. Cl.$^5$ ............... H01L 27/10; H01L 27/02; H01L 29/72
[52] U.S. Cl. ............................... 357/45; 357/46; 357/36; 357/34; 357/35
[58] Field of Search ............ 357/45, 36, 46, 34, 357/35

[56] References Cited

FOREIGN PATENT DOCUMENTS 0125968 11/1984 European Pat. Off. .

Primary Examiner—Rolf Hille
Assistant Examiner—Wael Fahmy
Attorney, Agent, or Firm—William A. Drucker

[57] ABSTRACT

The invention relates to a cellular power semiconductor device of the type comprising a substrate which comprises on its surface n-type and p-type cells (11, 12) alternating in a regular network. The various cells are connected respectively to two connection areas (90e, 90b) by means of two interconnection levels (100, 200) each comprising a pair of conductive sheets (30, 50; 70, 90) connected to one another in frontier zones (ZF ZF').

14 Claims, 4 Drawing Sheets

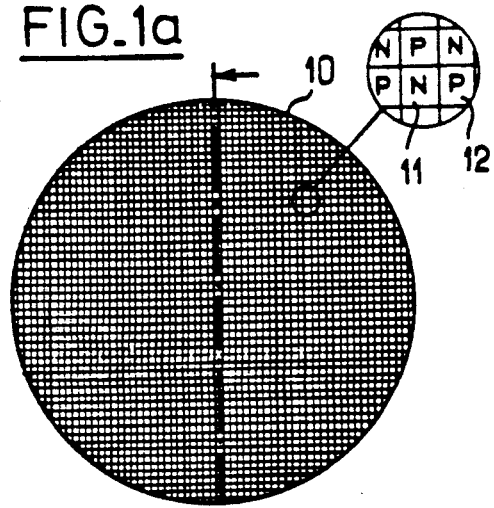
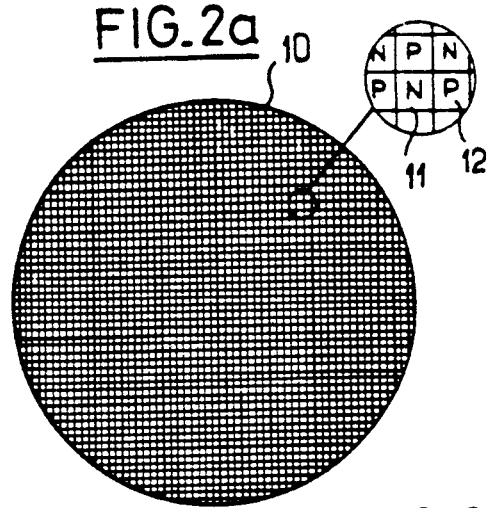
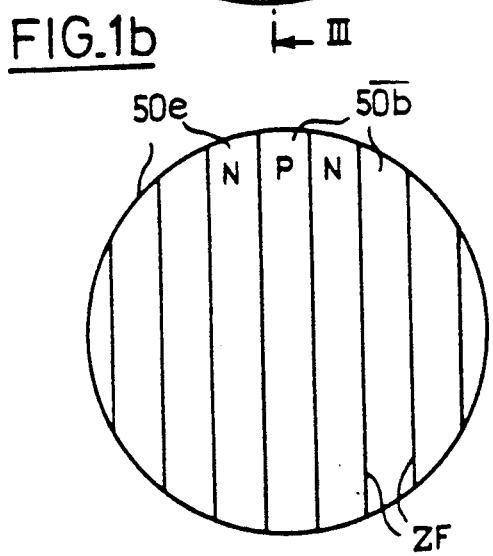
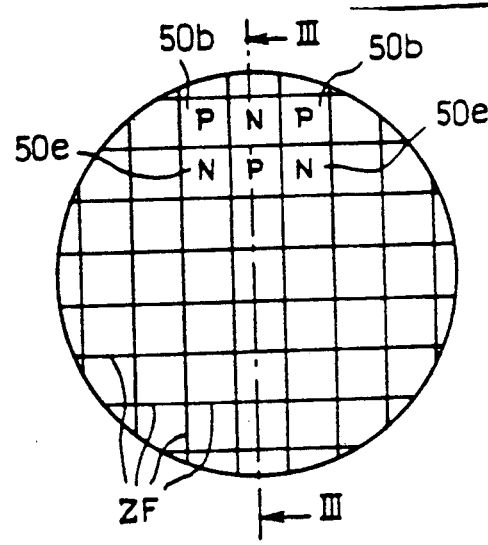
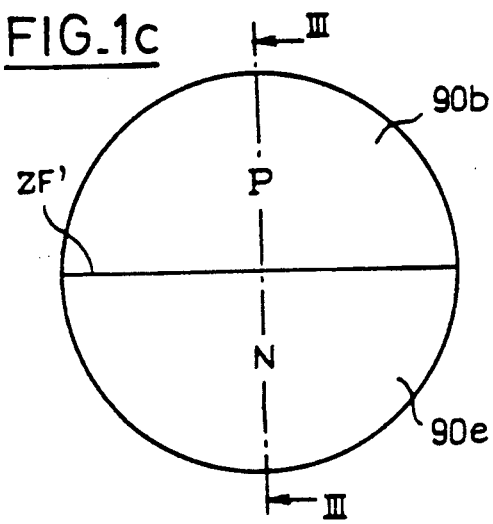
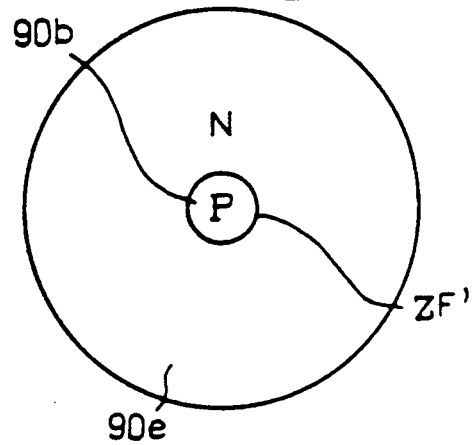

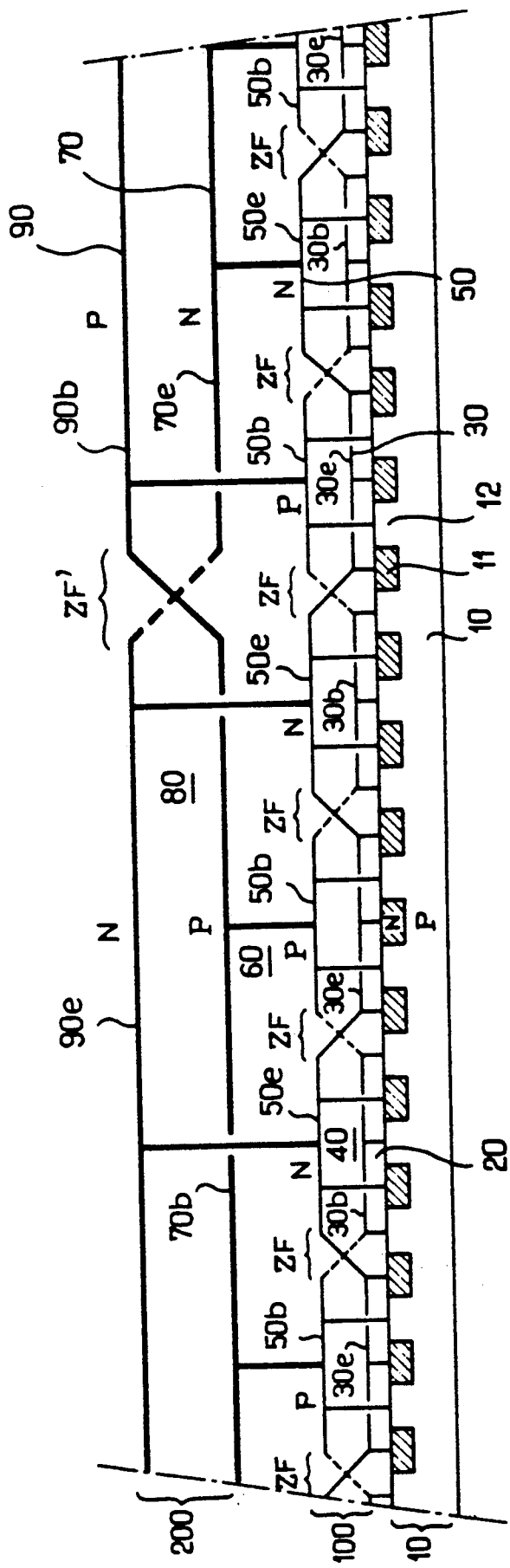
FIG_3

CELLULAR POWER SEMICONDUCTOR DEVICE

The present invention relates to a novel cellular power semiconductor device.

The invention relates more particularly to a cellular power semiconductor device of the type comprising a plurality of n-type or p-type zones diffused on the surface of a p-type or n-type substrate respectively so as to present, on the surface of the substrate, a plurality of diffused zones and zones of emergence of the substrate so arranged in relation to one another as to form a network of cells alternately of n-type and p-type. The cells of each type are all connected to one another and to a common conductive area defining one of the connection regions of the device.

One particular type of such a device is known, for example, from French Patent No. 2 545 654, its advantages over other devices of the same kind being good voltage and frequency performances and a completely homogenous supply of current to all the cells of the network.

However, if the current rating of the device is to be increased, the number of individual cells and therefore the surface of the chip and the conductive sheets are multiplied. The current paths between a current supplying terminal and the cells furthest away from the terminal are too long, so that they offer a high electric resistance, resulting in an appreciable drop in voltage.

In fact the aforementioned Patent enables devices to be produced which, with cells distributed with a pitch of a few tens of microns, have a surface limited to a few tens of square millimeters.

One present-day method of making devices having higher permissible power consists in reducing and juxtaposing a plurality of small devices and in interconnecting the connection areas of the same type of each of said individual devices by wiring. This known method is laborious, inconvenient to put into effect and not very reliable.

The present invention aims to reduce this disadvantage of the prior art and to provide a cellular semiconductor device which can carry higher currents and comprise a much larger number of cells on a semiconductor chip of proportionally increased size, without the current paths to or from the various cells offering excessive electric resistance.

Another object of the invention is to reduce the wiring necessities in a power semiconductor device.

To this end the invention relates to a cellular power semiconductor device of the type comprising a plurality of n-type or p-type zones diffused on the surface of a p-type or n-type substrate respectively so as to present, on the surface of the substrate, a plurality of diffused zones and zones of emergence of the substrate so arranged in relation to one another as to form a network of cells alternately of n-type and p-type, and means for connecting all the cells of each type to one another and to a connection area of the device, characterized in that said means comprise:

a first conductive sheet which extents above the surface of the substrate and is insulated therefrom and is divided in first frontier zones, in accordance with first predetermined patterns, into first and second alternate zones disposed in a network and insulated from one another, said first conductive sheet being connected to each of the subjacent n-type cells in its first zones and to each of the subjacent p-type cells in its second zones via first conductive pins;

a second conductive sheet which extends above the first sheet and is insulated therefrom and is also divided in the first frontier zones, in accordance with second predetermined patterns, into first and second alternate zones disposed in a network, insulated from one another and respectively superimposed on the first and second zones of the first conductive sheet, said second conductive sheet being connected to each of the subjacent p-type cells in its first zones and to each of the subjacent n-type cells in its second zones via second conductive pins which extend, in line with each of the cells, through the first sheet while remaining insulated therefrom and without breaking the electrical continuity thereof;

the first and second sheets being so connected to one another in said first frontier zones that each of the first and second zones of the first sheet are connected, inside said frontier zones, to the adjacent second and first zones respectively of the second sheet;

a third conductive sheet which extends above the second sheet and is insulated therefrom and is divided in a second frontier zone, in accordance with a third predetermined pattern, into a first zone and a second zone which are insulated from one another, said third conductive sheet being connected to each of the second subjacent zones of the second sheet in its first zone and to each of the first subjacent zones of the second sheet in its second zone via third conductive pins;

a fourth conductive sheet which extends above the third sheet and is insulated therefrom and is also divided in the second frontier zone, in accordance with a fourth predetermined pattern, into a first zone and a second zone which are insulated from one another and are superimposed on the first zone and the second zone of the third conductive sheet respectively, said fourth conductive sheet being connected to each of the first subjacent zones on the second sheet in its first zone and to each of the second subjacent zones of the second sheet in its second zone via fourth conductive pins which extend, in line with each of the cells, through the second sheet while remaining insulated therefrom and without breaking its electric continuity;

the third and fourth sheets being connected to one another in said second frontier zone so that the first and second zones of the third sheet are connected, inside said frontier zone, to the second and first zone of the fourth sheet respectively, said second and first zones each defining a connection area of the device, and the thickness of the third and fourth sheets is greater than that of the first and second sheets, and the third and fourth pins are larger than the first and second pins.

Preferred features of the device according to the invention are as follows:

the first and second patterns are not superimposed, so that a first zone of one of the first and second sheets and a second zone of the other sheet, said zones being situated on either side of a first frontier zone, face one another in respective projecting regions between which a conductive connection is established, and the third and fourth patterns are not superimposed, so that the first zone of one of the third and fourth sheets and the second zone of the other sheet, said zones being respectively situated on either side of the second frontier zone, face one another in respective projecting regions between which a conductive connection is established:

the network of cells and the network of conductive zones of the first and second sheets are periodic in at least one direction parallel with the first and second frontier zones respectively, the first and third patterns are regular patterns having a pitch equal to the pitches of the respective networks, and the second and fourth patterns are identical with the first and third patterns respectively, but symmetrical in relation to the directions of the respective frontier zones;

the network of cells is a draught-board network;

the network of the conductive zones of the first and second sheets is a draught-board network of directions parallel with those of the draught-board network of cells;

the network of conductive zones of the first and second sheets is a network of alternate parallel bands of direction parallel with one of the directions of the network of cells of the draught-board;

the connection areas are separated by a rectilinear or circular frontier zone;

the patterns of the second frontier zone have an amplitude and pitch which are larger than those of the first frontier zones and are so determined as to make possible the large thicknesses of the third and fourth conductive sheets.

In practice the present invention provides power semiconductor devices which, while having the same cell spacing pitch as in the prior art, can have a surface of up to several cm$^2$ without causing the aforementioned problems.

Other features, aims and advantages of the present invention will be better understood from the following detailed description of a preferred embodiment thereof, given by way of example and with reference to the accompanying drawings, wherein:

FIGS. 1a to 1c and 2a to 2c are diagrammatic horizontal sectional views of two different embodiments of a power semiconductor device according to the invention, at three different levels in the thickness of the device, FIG. 3 is a diagrammatic cross-sectional view, taken along the lines III—III, of a device constructed as shown in FIGS. 1a, 2b and 1c, and FIGS. 4a and 4b are perspective views to two different scales, with portions removed, of an embodiment of a device according to the invention.

As far as possible like references are used to those in French Patent No. 2 545 654, which is incorporated in the present description for reference, and which can be consulted for further details concerning the production of the devices according to the present invention, which may be based on the principles set forth in that Patent.

The device illustrated is a bipolar npn power transistor comprising a p-type semiconductor substrate 10 in which a plurality of n-type zones 11 are diffused disposed in a regular network, as in the aforementioned Patent. The diffused zones 11 alternate with zones of emergence 12 of the substrate in a draught-board pattern. The pitch of the pattern can be, for example, several tens of microns.

A first interconnection level is provided on the semiconductor substrate. It comprises a first insulating layer 20, a lower conductive sheet 30, a second insulating sheet 40 and an upper conductive sheet 50, the general organization following the principles of French Patent No. 2 545 654.

In a first essential feature of the invention, the purpose of the first interconnection level is not to produce the two conductive connection areas, but to form a second network of much larger pitch than that of the individual cells of the substrate 10 and formed by conductive zones alternately conducted to the subjacent p-type and n-type cells. These zones have the references 50b and 50e in FIG. 1b and correspond to the base and emittor of the transistor respectively. The pitch of the second network is of the order of several fractions of a millimeter to several millimeters. The second network is either a network of bands (FIG. 1b) or a draught-board network (FIG. 2b).

According to a second essential feature of the invention, the semiconductor has a second interconnection level for the purpose of connecting all the conductive zones of the same type (zones 50b and 50e respectively) to two external conductive areas 90b and 90e respectively which determine the connection areas. In a first embodiment (FIG. 1c) the areas 90b, 90e each occupy about one half of the surface of the chip and are insulated from one another by a diametrical frontier zone. The chip can have a surface of the order of several cm$^2$.

In a second embodiment (FIG. 2c), which facilitates the rapid assembly of the device, the areas 90b, 90e are disposed concentrically. The base area 90b has a surface much smaller than that of the emitter area 90e, which carries a much higher current.

The embodiments illustrated in FIGS. 1c and 2c can each be obtained from the networks illustrated in one or the other of FIGS. 1b and 2b.

Of course, any other embodiment can be envisaged, as described in the aforementioned Patent. The respective geometries of the p-type and n-type zones of the substrate, of the conductive zones of the first level and of the conductive connection areas of the second level can be designed relatively independently of one another.

FIG. 3 illustrates diagrammatically the principle of the arrangement and interconnection of the various conductive sheets 30, 50, 70, 90 and also of the insulating layers 20, 40 of the first level and 60, 80 of the second level. The two conductive areas 90b, 90e are connected on the one hand to connection terminals and on the other to all the respective conductive zones 50b, 50e and therefore to all the respective p-type and n-type cells of the substrate. The thickness of the sheets 70, 90 is much larger than that of the sheets 30, 50, while the thickness of the insulating layers 60, 80 can be of the same order of magnitude as that of the insulating layers 20, 40, as will be shown hereinafter.

FIG. 4a repeats, in partly cutaway perspective and in detail, the structure described in French Patent No. 2 545 654 and uses like references to those therein, so that reference can therefore usefully be made to the descriptive part of that Patent. Although for reasons of clarity FIG. 4a shows only one conductive zone 50b and one conductive zone 50e, which are separated by a rectilinear frontier zone ZF, in reality the semiconductor will comprise a plurality of such conductive zones. The first and second conductive sheets 30 and 50 are subdivided into zones by a plurality of frontier zones ZF forming either a network of parallel bands or a draught-board network. FIG. 4a shows a draught-board network. The undulations corresponding to the transitions 53 between the conductive zones 50b, 50e are visible in FIG. 4a; they have an amplitude equal to half the width of the frontier zone ZF and a pitch corresponding to the mesh of the network of cells. The difference in scale as between FIGS. 4a and 4b (typically in a ratio which can reach 100) means in practice that these undulations should be imperceptible in FIG. 4b, which shows the diffused substrate 10, the first interconnection level 100 and the second interconnection level 200 which comprises the insulating layer 60, the third conductive sheet 70, the insulating layer 80 and the fourth conductive sheet 90.

Figure 4B:
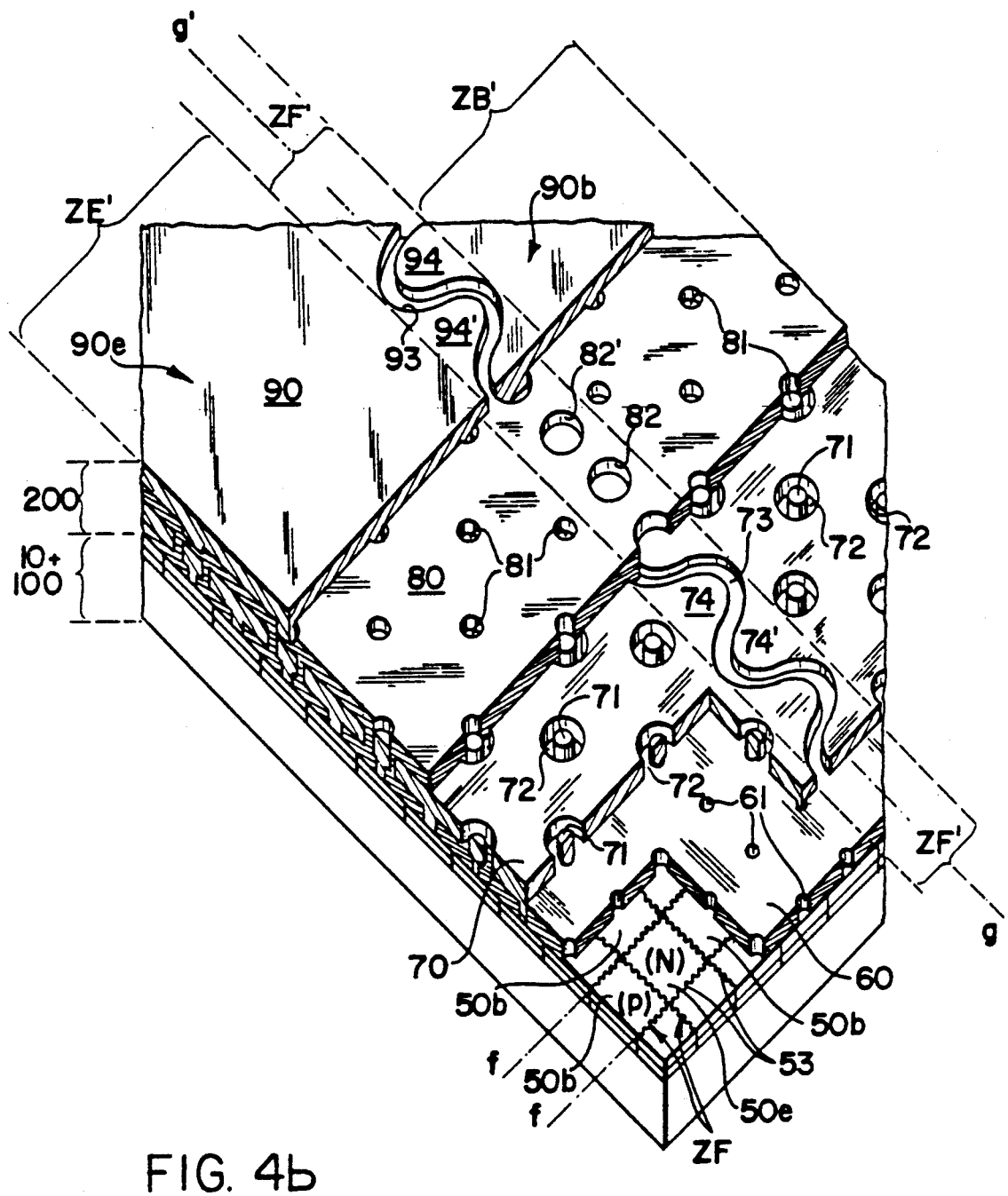

In FIG. 4b like elements to those shown in FIG. 4a have like references with the addition of 40. Certain letter references are also followed by a prime in FIG. 4b. The description of French Patent No. 2 545 654 is therefore also of interest, apart from the reference numerals, as regards the make-up and manner of putting into effect the external level 200 of the power semiconductor.

The insulating layer 60 deposited above the conductive zones 50b, 50e comprises a series of openings 61 situated in line with each of the subjacent zones 50b, 50e and also openings (not shown) situated in line with said zones in a frontier zone ZF' defined on either side of an axis gg' which divides the device into two regions ZB' and ZE'.

The frontier zone ZF' is a rectilinear band having the width of a conductive zone 50b or 50e.

The lower or third conductive sheet 70 is deposited on the whole of the device and at that moment therefore connects all the conductive zones 50b, 50e via the openings 61.

Pins 71 are then insulated in line with each zone 50e in the region ZE' and in line with each zone 50b in the region ZB'. The trimming of each pin 71 is obtained by the formation of a circular groove 72 hollowed out from the full thickness of the sheet 70. In this way in the zone ZE' the conductive zones 50b are all interconnected via the sheet 70, and all the conductive zones 50e are insulated. The converse phenomenon is obtained in the zone ZB'.

During this same stage of the process there is formed in the sheet 70 a continuous groove 73 dividing the sheet in the frontier zone ZF' into two half-sheets insulated from one another and covering the zones ZE' and ZB' respectively.

The groove preferably has the periodic sinusoidal shape illustrated, its amplitude being half the width of the zone ZF' and its period being equal to the mesh of the network of zones 50b, 50e. As in the case of the groove 33 shown in FIG. 4a, the groove 73 can follow any other suitable pattern, on condition that it defines an alternation of projecting zones 74, 74' belonging to the half-layer of the zone ZE' and the half-layer of the zone ZB' respectively.

An insulating layer 80 is then applied to the whole of the device, whereafter the apexes 81 of each of the pins 71 are etched off. During this same stage additional openings 82, 82' are also etched out along the frontier zone ZF' on either side of the groove previously produced. The openings 82 correspond to the projecting regions of the zone ZE', while the openings 82' correspond to the projecting regions 74' of the zone ZB'.

A fourth conductive sheet 90 is then deposited on the whole of the device, thus ensuring an electrical connection between all the pins 71 of the device and all the additional openings 82, 82' previously made.

The last stage in producing the device consists in making a second groove 93 in the whole thickness of the sheet 90 along the zone ZF'. The sheet 90 is therefore divided into two half-sheets electrically insulated from one another.

The groove 97 is produced in accordance with a pattern so offset in relation to the pattern of the groove 73 that the pairs of lower and upper conductive half-layers disposed on either side of the frontier zone respectively each have at least one facing zone in line with the additional openings 82, 82'. More precisely, the projecting regions 74, 94 face one another in line with the openings 82, and the projecting regions 74', 94' face one another in line with the openings 82'.

In this way the half-layer 90e of the zone ZE' is in contact with the half-layer 70e on the ZB' side of the sheet 70 through the openings 82'. However, these two half-layers are each in electrical contact with all the subjacent n-type conductive zones 50e. This gives access via the conductive area 90e, forming an emitter connection area of the device, to the whole of said zones 50e, and consequently to the whole of the n-type zones 11 of the substrate 10.

By similar reasoning it can be demonstrated that the conductive area 90b, in electrical contact with the half-layer 70b via the openings 82, is connected to the whole of the conductive zones 50b, and consequently to the whole of the p-type zones of emergence 12 of the substrate 10, where it forms the base connection area of the device.

In practice the conductive sheets 70, 90 of the second level 200 can be made of the same material as the conductive sheets 30, 50 of the first level, for example, of aluminium, but with a much larger thickness than that of the last-mentioned sheets, current densities being much higher in the first-mentioned sheets. The patterns of the frontier zone ZF' have an amplitude and pitch which are much large than those of the patterns of the frontier zones ZF. The definition (precision) with which the zones ZF' are formed can therefore be rougher than that required for producing the zones ZF; this is highly advantageous, since the large thicknesses required for the sheets 70, 90 of the second level can readily be obtained.

It may also be noted that the insulating layers 60, 80 can be formed in a similar manner to the insulating layers 20, 50 and have the same thickness, since the potential differences to which they will be subjected are identical (base/emitter voltage in the case illustrated of an npn-type bipolar transistor).

It is possible, in certain cases, by suitably modifying the structure of the second interconnection level 200 of the device to produce several areas 90e and several areas 90b connected to one another either by wiring or via suitable conductive tracks in a wafer bearing the device.

Lastly, the invention applies not only to bipolar transistors, but also to other power devices, such as ordinary fast thyristors or more particularly to gate-openable thyristors, and also to insulated grid bipolar transistors (IGBT) or MOS power transistors.

I claim:

1. A cellular power semiconductor device of the type comprising a plurality of n-type or p-type zones (11)

diffused on the surface of a p-type or n-type substrate (10) respectively so as to present on the surface of the substrate a plurality of diffused zones (11) and zones of emergence (12) of the substrate so arranged in relation to one another as to form a network of cells alternately of n-type and p-type, and means for connecting all the cells of each type to one another and to a connection area (90e, 90b) of the device, characterized in that said means comprise:

- a first conductive sheet (30) which extents above the surface of the substrate and is insulated therefrom and is divided in first frontier zones (ZF), in accordance with first predetermined patterns (33), into first and second alternate zones (30e, 30b) disposed in a network and insulated from one another, said first conductive sheet being connected to each of the subjacent n-type cells in its first zones and to each of the subjacent p-type cells in its second zones via first conductive pins;
- a second conductive sheet (50) which extends above the first sheet and is insulated therefrom and is also divided in the first frontier zones (ZF), in accordance with second predetermined patterns (53), into first and second alternate zones (50b, 50e) disposed in a network, insulated from one another and respectively superimposed on the first and second zones (30e, 30b) of the first conductive sheet, said second conductive sheet being connected to each of the subjacent p-type cells in its first zones and to each of the subjacent n-type cells in its second zones via second conductive pins (31) which extend, in line with each of the cells, through the first sheet (30) while remaining insulated therefrom and without breaking the electrical continuity thereof;
the first and second sheets being so connected to one another in said first frontier zones (ZF) that each of the first and second zones (30e, 30b) of the first sheet (30) are connected, inside said frontier zones, to the adjacent second and first zones (50e, 50b) respectively of the second sheet (50);
- a third conductive sheet (70) which extends above the second sheet and is insulated therefrom and is divided in a second frontier zone (ZF'), in accordance with a third predetermined pattern (73), into a first zone and a second zone (70e, 70b) which are insulated from one another, said third conductive sheet being connected to each of the second subjacent zones (50e) of the second sheet (50) in its first zone (70e) and to each of the first subjacent zones (50b) of the second sheet (50) in its second zone (70b) via third conductive pins;
- a fourth conductive sheet (90) which extends above the third sheet (70) and is insulated therefrom and is also divided in the second frontier zone (ZF'), in accordance with a fourth predetermined pattern (93), into a first zone and a second zone (90b, 90e) which are insulated from one another and are superimposed on the first zone and the second zone (70e, 70b) of the third conductive sheet respectively, said fourth conductive sheet being connected to each of the first subjacent zones (50b) on the second sheet (50) in its first zone (90b) and to each of the second subjacent zones (50e) of the second sheet (50) in its second zone (90e) via fourth conductive pins (71) which extend, in line with each of the cells, through the second sheet (70) while remaining insulated therefrom and without breaking its electric continuity;

the third and fourth sheets (70, 90) being connected to one another in said second frontier zone (ZF') so that the first and second zones (70e, 70b) of the third sheet (70) are connected, inside said frontier zone, to the second and first zone (90e, 90b) of the fourth sheet respectively, said second and first zones (90e, 90b) each defining a connection area of the device, and the thickness of the third and fourth sheets (70, 90) is greater than that of the first and second sheets (30, 50), and the third and fourth pins are larger than the first and second pins.

2. A device according to claim 1, characterized in that the first and second patterns (33, 53) are not superimposed, so that a first zone (30e, 50b) of one of the first and second sheets and a second zone (50e, 30b) of the other sheet, said zones being situated on either side of a first frontier zone (ZF), face one another in respective projecting regions (34', 54'; 34, 54) between which a conductive connection is established, and the third and fourth patterns (73, 93) are not superimposed, so that the first zone (70e, 90b) of one of the third and fourth sheets and the second zone (90e, 70b) of the other sheet, said zones being respectively situated on either side of the second frontier zone (ZF'), face one another in respective projecting regions (74, 94; 74', 94') between which a conductive connection is established.

3. A device according to claim 2, characterized in that the network of cells (11, 12) and the network of conductive zones of the first and second sheets (30, 50) are periodic in at least one direction parallel with the first and second frontier zones (ZF, ZF') respectively, the first and third patterns (33, 73) are regular patterns having a pitch equal to the pitches of the respective networks, and the second and fourth patterns (53, 93) are identical with the first and third patterns respectively, but symmetrical in relation to the directions (f'f, g'g) of the respective frontier zones (ZF, ZF').

4. A device according to claim 3, characterized in that the network of cells (11, 12) is a draught-board network.

5. A device according to claim 4, characterized in that the network of the conductive zones (30e, 30b; 50b, 50e) of the first and second sheets is a draught-board network of directions parallel with those of the draught-board network of cells.

6. A device according to claim 4, characterized in that the network of conductive zones (30e, 30b; 50b, 50e) of the first and second sheets is a network of alternate parallel bands of direction parallel with one of the directions of the network of cells of the draught-board.

7. A device according to claim 5, characterized in that the connection areas (90e, 90b) are separated by a rectilinear frontier zone (ZF').

8. A device according to claim 5, characterized in that the connection areas (90e, 90b) are separated by a frontier zone (ZF') of generally circular shape.

9. A device according to claim 1, characterized in that the patterns of the second frontier zone (ZF') have an amplitude and pitch which are larger than those of the first frontier zones (ZF) and are so determined as to make possible the large thicknesses of the third and fourth conductive sheets (70, 90).

10. A device according to claim 6, characterized in that the connection areas (90e, 90b) are separated by a rectilinear frontier zone (ZF').

11. A device according to claim 6, characterized in that the connection areas (90e, 90b) are separated by a frontier zone (ZF') of generally circular shape.

12. A device according to claim 8, characterized in that the patterns of the second frontier zone (ZF') have an amplitude and pitch which are larger than those of the first frontier zones (ZF) and are so determined as to make possible the large thicknesses of the third and fourth conductive sheets (70, 90).

13. A device according to claim 10, characterized in that the patterns of the second frontier zone (ZF') have an amplitude and pitch which are larger than those of the first frontier zones (ZF) and are so determined as to make possible the large thicknesses of the third and fourth conductive sheets (70, 90).

14. A device according to claim 11, characterized in that the patterns of the second frontier zone (ZF') have an amplitude and pitch which are larger than those of the first frontier zones (ZF) and are so determined as to make possible the large thicknesses of the third and fourth conductive sheets (70, 90).

* * * * *